United States Patent
Veijalainen et al.

(10) Patent No.: US 12,034,453 B2
(45) Date of Patent: Jul. 9, 2024

(54) PROTOCOL DATA UNIT (PDU) ERROR PROBABILITY FEEDBACK

(71) Applicant: NOKIA TECHNOLOGIES OY, Espoo (FI)

(72) Inventors: Teemu Veijalainen, Helsinki (FI); Lauri Kuru, Espoo (FI); Petteri Kela, Kaarina (FI); Jani Moilanen, Helsinki (FI)

(73) Assignee: NOKIA TECHNOLOGIES OY, Espoo (FI)

( * ) Notice: Subject to any disclaimer, the term of this patent is extended or adjusted under 35 U.S.C. 154(b) by 60 days.

(21) Appl. No.: 17/780,768

(22) PCT Filed: Dec. 19, 2019

(86) PCT No.: PCT/US2019/067440
§ 371 (c)(1),
(2) Date: May 27, 2022

(87) PCT Pub. No.: WO2021/126206
PCT Pub. Date: Jun. 24, 2021

(65) Prior Publication Data
US 2023/0043492 A1    Feb. 9, 2023

(51) Int. Cl.
*H03M 13/01*    (2006.01)
*H03M 13/37*    (2006.01)
(Continued)

(52) U.S. Cl.
CPC ....... *H03M 13/01* (2013.01); *H03M 13/3738* (2013.01); *H04L 1/0026* (2013.01); *H04L 1/20* (2013.01)

(58) Field of Classification Search
CPC ....... H04L 1/0026; H04L 1/20; H04L 1/0061; H04L 1/08; H03M 13/01; H03M 13/3738; H03M 13/09
See application file for complete search history.

(56) References Cited

U.S. PATENT DOCUMENTS 8,451,726 B2 *   5/2013  Baldo .................. H04L 1/0002
                                                  370/332
10,986,528 B2 *   4/2021  Dao ..................... H04L 12/1407
(Continued)

FOREIGN PATENT DOCUMENTS

EP    1220472 A1    7/2002
EP    3113368 A1    1/2017
(Continued)

OTHER PUBLICATIONS

Y. Chosokabe, T. Uwai, Y. Nagao, L. Lanante and H. Ochi, "A channel adaptive hybrid aggregation scheme for next generation wireless LAN," 2015 IEEE Wireless Communications and Networking Conference Workshops (WCNCW), New Orleans, LA, USA, 2015, pp. 153-158 (Year: 2015).*
(Continued)

*Primary Examiner* — Cynthia Britt
(74) *Attorney, Agent, or Firm* — SQUIRE PATTON BOGGS (US) LLP

(57) ABSTRACT

Systems, methods, apparatuses, and computer program products for error probability feedback are provided. One method may include transmitting, to at least one user equipment, a configuration for protocol data unit error probability calculation and reporting. The method may also include receiving, from the at least one user equipment, feedback related to the protocol data unit error probability.

28 Claims, 9 Drawing Sheets

(51) Int. Cl.
*H04L 1/00* (2006.01)
*H04L 1/20* (2006.01)

(56) References Cited

U.S. PATENT DOCUMENTS

| | | | |
|---|---|---|---|
| 11,343,714 B2* | 5/2022 | Aktas | ............... H04W 28/06 |
| 2008/0076359 A1 | 3/2008 | Charpentier et al. | |
| 2012/0224500 A1 | 9/2012 | Shinohara et al. | |
| 2014/0301210 A1 | 10/2014 | Kim et al. | |
| 2016/0338074 A1 | 11/2016 | Chou et al. | |
| 2016/0352467 A1* | 12/2016 | Rawat | ............... H04L 1/1848 |
| 2017/0295054 A1 | 10/2017 | Lee et al. | |
| 2019/0253917 A1 | 8/2019 | Dao | |
| 2019/0349119 A1 | 11/2019 | Nammi et al. | |
| 2022/0216948 A1* | 7/2022 | Yi | ............... H04L 67/12 |
| 2022/0360501 A1* | 11/2022 | Veijalainen | ............ H04L 43/12 |

FOREIGN PATENT DOCUMENTS

| | | |
|---|---|---|
| EP | 3206322 A1 | 8/2017 |
| WO | 2018028497 A1 | 2/2018 |
| WO | 2019/173957 A1 | 9/2019 |
| WO | 2020193118 A1 | 10/2020 |

OTHER PUBLICATIONS

Extended European Search Report dated Jul. 21, 2023, corresponding to European Patent Application No. 19957032.6.
Interdigital Inc: "Control of PDCP duplication", 3GPP Draft; R2-1704916 (R15 NR WI A1022 PDCP Duplication), 3rd Generation Partnership Project (3GPP), Mobile Competence Centre ; 650, Route Des Lucioles ; F-06921 Sophia-Antipolis Cedex ; France , vol. RAN WG2, No. Hangzhou, China; May 15, 2017-May 19, 2017 May 6, 2017.
G. Pocovi et al., "Joint Link Adaptation and Scheduling for 5G Ultra-Reliable Low-Latency Communications", in IEEE Access, vol. 6, May 2018.
F. Blanquez-Casado et al., "eOLLA: an enhanced outer loop link adaptation for cellular networks", in EURASIP Journal on Wireless Communications and Networking, Jan. 2016.
K. Pedersen et al., "Frequency Domain Scheduling for OFDMA with Limited and Noisy Channel Feedback", in IEEE 66th Vehicular Technology Conference (VTC), Oct. 2007.
P. Kela et al., "Dynamic packet scheduling performance in UTRA Long Term Evolution downlink", 3rd International Symposium on Wireless Pervasive Computing (ISWPC), May 2008.
International Search Report and Written Opinion dated Feb. 28, 2020 corresponding to International Patent Application No. PCT/US2019/067440.
3GPP TS 22.104 V17.1.0 (Sep. 2019), Technical Specification, 3rd Generation Partnership Project; Technical Specification Group Services and System Aspects; Service requirements for cyber-physical control applications in vertical domains; Stage 1 (Release 17), Sep. 2019.
3GPP TS 38.300 V15.7.0 (Sep. 2019), Technical Specification, 3rd Generation Partnership Project; Technical Specification Group Radio Access Network; NR; NR and NG-RAN Overall Description; Stage 2 (Release 15), Sep. 2019.
International Search Report and Written Opinion dated May 11, 2021 corresponding to International Patent Application No. PCT/FI2020/050748.

* cited by examiner

PROTOCOL DATA UNIT (PDU) ERROR PROBABILITY FEEDBACK

FIELD

Some example embodiments may generally relate to mobile or wireless telecommunication systems, such as Long Term Evolution (LTE) or fifth generation (5G) radio access technology or new radio (NR) access technology, or other communications systems. For example, certain embodiments may relate to systems and/or methods for error probability feedback.

BACKGROUND

Examples of mobile or wireless telecommunication systems may include the Universal Mobile Telecommunications System (UMTS) Terrestrial Radio Access Network (UTRAN), Long Term Evolution (LTE) Evolved UTRAN (E-UTRAN), LTE-Advanced (LTE-A), MulteFire, LTE-A Pro, and/or fifth generation (5G) radio access technology or new radio (NR) access technology. 5G wireless systems refer to the next generation (NG) of radio systems and network architecture. A 5G system is mostly built on a 5G new radio (NR), but a 5G (or NG) network can also build on the E-UTRA radio. It is estimated that NR provides bitrates on the order of 10-20 Gbit/s or higher, and can support at least service categories such as enhanced mobile broadband (eMBB) and ultra-reliable low-latency-communication (URLLC) as well as massive machine type communication (mMTC). NR is expected to deliver extreme broadband and ultra-robust, low latency connectivity and massive networking to support the Internet of Things (IoT). With IoT and machine-to-machine (M2M) communication becoming more widespread, there will be a growing need for networks that meet the needs of lower power, low data rate, and long battery life. The next generation radio access network (NG-RAN) represents the RAN for 5G, which can provide both NR and LTE (and LTE-Advanced) radio accesses. It is noted that, in 5G, the nodes that can provide radio access functionality to a user equipment (i.e., similar to the Node B, NB, in UTRAN or the evolved NB, eNB, in LTE) may be named next-generation NB (gNB) when built on NR radio and may be named next-generation eNB (NG-eNB) when built on E-UTRA radio.

SUMMARY

One embodiment is directed to an apparatus that may include at least one processor and at least one memory comprising computer program code. The at least one memory and computer program code configured, with the at least one processor, to cause the apparatus at least to transmit, to at least one user equipment, configuration for protocol data unit error probability calculation and reporting, and to receive, from the at least one user equipment, feedback related to the protocol data unit error probability.

Another embodiment is directed to a method that may include transmitting, to at least one user equipment, configuration for protocol data unit error probability calculation and reporting, and receiving, from the at least one user equipment, feedback related to the protocol data unit error probability.

Another embodiment is directed to apparatus that may include means for transmitting, to at least one user equipment, configuration for protocol data unit error probability calculation and reporting, and means for receiving, from the at least one user equipment, feedback related to the protocol data unit error probability.

Another embodiment is directed to an apparatus that may include at least one processor and at least one memory comprising computer program code. The at least one memory and computer program code configured, with the at least one processor, to cause the apparatus at least to receive, from a network node, configuration for protocol data unit error probability calculation and reporting for at least one network layer, to enable logging and estimating of block error probability, to calculate the protocol data unit error probability for the at least one network layer based on the received configuration and the block error probability estimation, and to transmit, to the network node, feedback related to the protocol data unit error probability.

Another embodiment is directed to a method that may include receiving, at a user equipment, a configuration from a network node, where the configuration is for protocol data unit error probability calculation and reporting for at least one network layer. The method may also include enabling logging and estimating of block error probability, calculating the protocol data unit error probability for the at least one network layer based on the received configuration and the block error probability estimation, and transmitting, to the network node, feedback related to the protocol data unit error probability.

Another embodiment is directed to apparatus that may include means for receiving, from a network node, a configuration for protocol data unit error probability calculation and reporting for at least one network layer, means for enabling logging and estimating of block error probability, means for calculating the protocol data unit error probability for the at least one network layer based on the received configuration and the block error probability estimation, and means for transmitting, to the network node, feedback related to the protocol data unit error probability.

BRIEF DESCRIPTION OF THE DRAWINGS

For proper understanding of example embodiments, reference should be made to the accompanying drawings, wherein:

FIG. 4A illustrates an example table of the classification of actions based on the PDCP-PDU-EP feedback, according to an embodiment;

FIG. 4B illustrates a table depicting an example of classification by considering reliability and delay target, according to an embodiment;

DETAILED DESCRIPTION

Figure 1A:
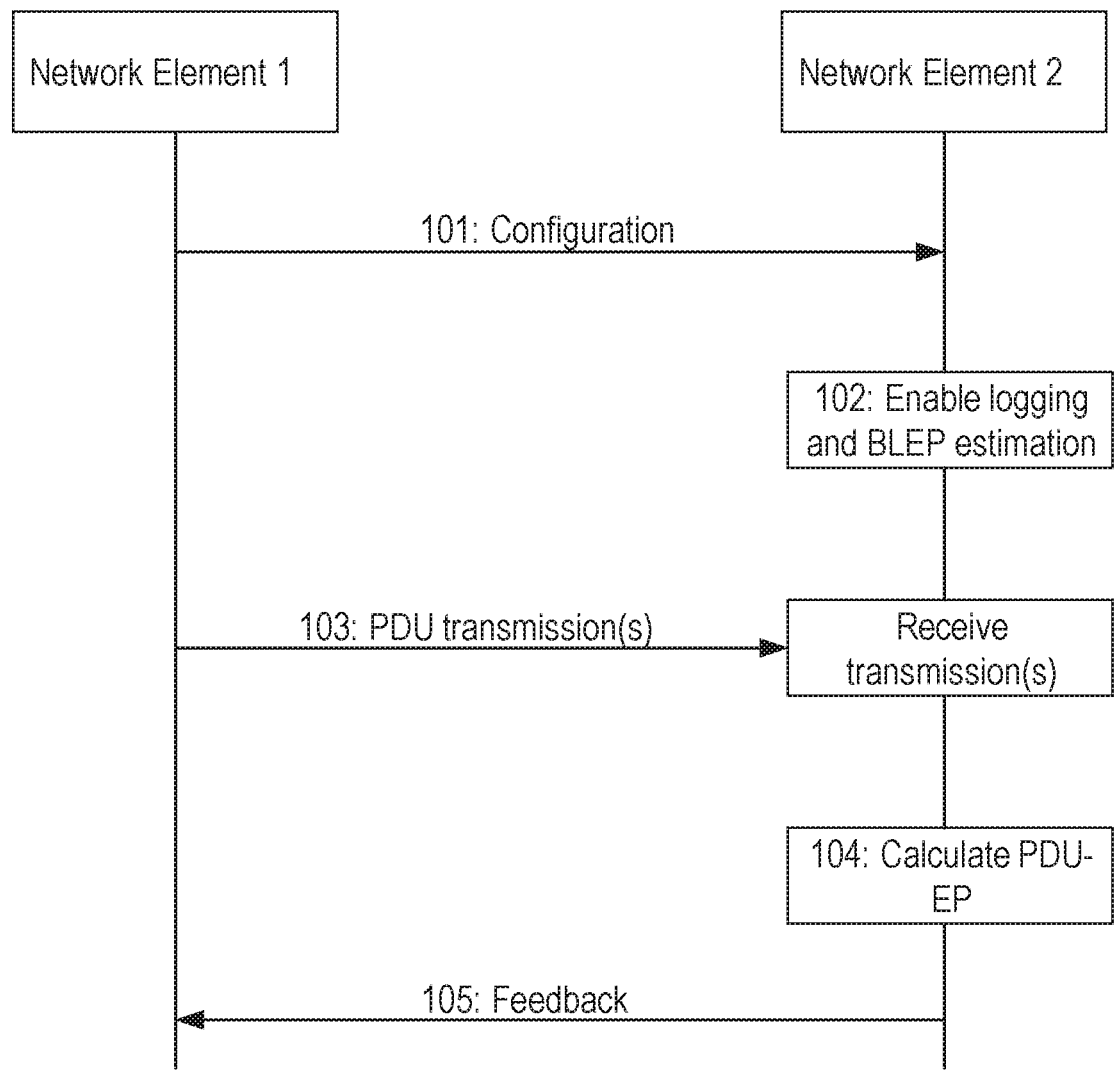
FIG. 1A illustrates an example signaling diagram, according to an embodiment.

It will be readily understood that the components of certain example embodiments, as generally described and illustrated in the figures herein, may be arranged and designed in a wide variety of different configurations. Thus, the following detailed description of some example embodiments of systems, methods, apparatuses, and computer program products for error probability feedback, is not intended to limit the scope of certain embodiments but is representative of selected example embodiments.

The features, structures, or characteristics of example embodiments described throughout this specification may be combined in any suitable manner in one or more example embodiments. For example, the usage of the phrases "certain embodiments," "some embodiments," or other similar language, throughout this specification refers to the fact that a particular feature, structure, or characteristic described in connection with an embodiment may be included in at least one embodiment. Thus, appearances of the phrases "in certain embodiments," "in some embodiments," "in other embodiments," or other similar language, throughout this specification do not necessarily all refer to the same group of embodiments, and the described features, structures, or characteristics may be combined in any suitable manner in one or more example embodiments.

Additionally, if desired, the different functions or procedures discussed below may be performed in a different order and/or concurrently with each other. Furthermore, if desired, one or more of the described functions or procedures may be optional or may be combined. As such, the following description should be considered as illustrative of the principles and teachings of certain example embodiments, and not in limitation thereof.

Certain embodiments may relate to optimization and/or improvement of URLLC, for example, by introducing a new radio feedback to measure reliability of a radio link. URLLC is a relatively new area for wireless communication, and is considered as an important pillar in 5th generation (5G) cellular networks (the others including enhanced mobile broadband and massive machine type of communication). URLLC potentially opens a wide variety of new use cases for wireless networks in various vertical domains such as, but not limited to, industry automation or eHealth. Private and virtual private networks to support the vertical use cases with 5G is expected to be a promising growth area in the wireless industry.

One challenge related to URLLC is that URLLC sets new, more stringent optimization criteria for the network deployments. For example, the network should support ultra-high reliability (e.g. 99.999% or higher) and, in some cases, can also support extremely low e2e latency and jitter (e.g., guaranteed, deterministic latency of 1 ms and microsecond-level jitter). While certain embodiments described herein are applicable to, and may be described in connection with, 5G URLLC use cases, it should be noted that some embodiments are applicable also to other 5G use cases (e.g., eMBB and mMTC), as well as other wireless technologies (e.g., industrial Wi-Fi).

In a radio network, measurement and evaluation of URLLC application service level requirements are sometimes a difficult task. As one example, for instance for an application that sends a packet every 100 ms and has $10^{-7}$ packet error probability target, one error can occur every 28 hours on average. To verify this, measurements from ever-longer period is needed to have statistically meaningful set of samples. Moreover, network optimization typically includes iterations, leading to even longer optimization time for URLLC. For real-time optimizations (e.g., for radio resource management), measurement interval should be significantly shorter (in order of tens or hundreds of milliseconds). For non-real time optimizations (e.g., self-organizing networks) longer measurement periods can be tolerated, but optimization periods of several days may be problematic as it could take an unreasonably long time before the network would stabilize towards some optimum state (or the algorithm may not be able to find any stable optimum if radio environment changes). Furthermore, during the optimization period, normal operation may not be possible as this may compromise performance of the critical URLLC applications. Thus, one problem may relate to how to shorten the very long time that is required to collect application failure or packet error probability statistics in URLLC use cases.

Another problem relates to feasibility of existing radio feedback for radio link performance optimization. URLLC applications typically have QoS requirements related to packet error probability; for instance, each packet arriving to a gNB should be delivered within certain delay and with certain probability, or only certain amount of consecutive packet errors are tolerated within a certain time window. Alternatively, a requirement may relate to error probability target on some radio layer such as packet data convergence protocol (PDCP).

When a packet arrives to the gNB, it is passed to lower layers; at each layer, the data from may be split to one or more segments which are again passed to lower layers. When it reaches physical layer (PHY), the bits of the packet may have been split to multiple code blocks, which are transmitted over different physical radio resource blocks, each potentially having de-correlating radio channel conditions. An existing method is to tune block error probability (BLEP) to a certain percentage with the help of channel quality indicator (CQI) reports, which have proven to be a reasonable method, e.g., to optimize MBB type traffic. However, since BLEP or CQI does not fully correlate with above-mentioned URLLC requirements, another problem relates to how to provide better suitable feedback mechanisms to optimize performance requirements above physical layer, such as URLLC quality of service (QoS). Therefore, an overriding problem relates to how to estimate performance (close to real time), on layers above physical, without extensive collection of measurements.

Certain embodiments provide methods that are able to address and solve at least the problems discussed above.

For example, certain embodiments provide a new feedback mechanism for a transmitter to obtain error probability estimate of protocol data unit (PDU) at any radio layer. This new key performance indicator (KPI) may be referred to as PDU error probability (PDU-EP) or Lx-PDU-EP, where Lx refers to the layer where the estimate is computed (e.g., between PHY and service data adaptation protocol (SDAP)). In an embodiment, a receiver may track which code blocks (CB) contributed to transmission of the Lx-PDU and may calculate the PDU-EP based on BLEP estimates of the decoded user plane CBs.

According to some embodiments, the BLEP estimate can be computed at the receiver (e.g., UE) based on mutual information (MI) based link to system mapping, e.g., mutual information effective signal-to-noise ratio (SNR) mapping (MIESM). For example, BLEP may be computed from successfully received user plane data (e.g., CB's that contributed to transmission of the Lx-PDU) considering the actual modulation coding scheme (MCS) and code block size and the effective signal-to-interference-and-noise ratio (SINR) after decoding. In some embodiments, the precise method of BLEP estimation may be left up to receiver implementation, or may be standard defined.

FIGS. 1A, 1B, 1C, and 1D illustrate example signaling diagrams, according to various example embodiments. It should be noted that FIGS. 1A-1D are just some examples, and other examples are possible according to certain embodiments.

Figure 1B:
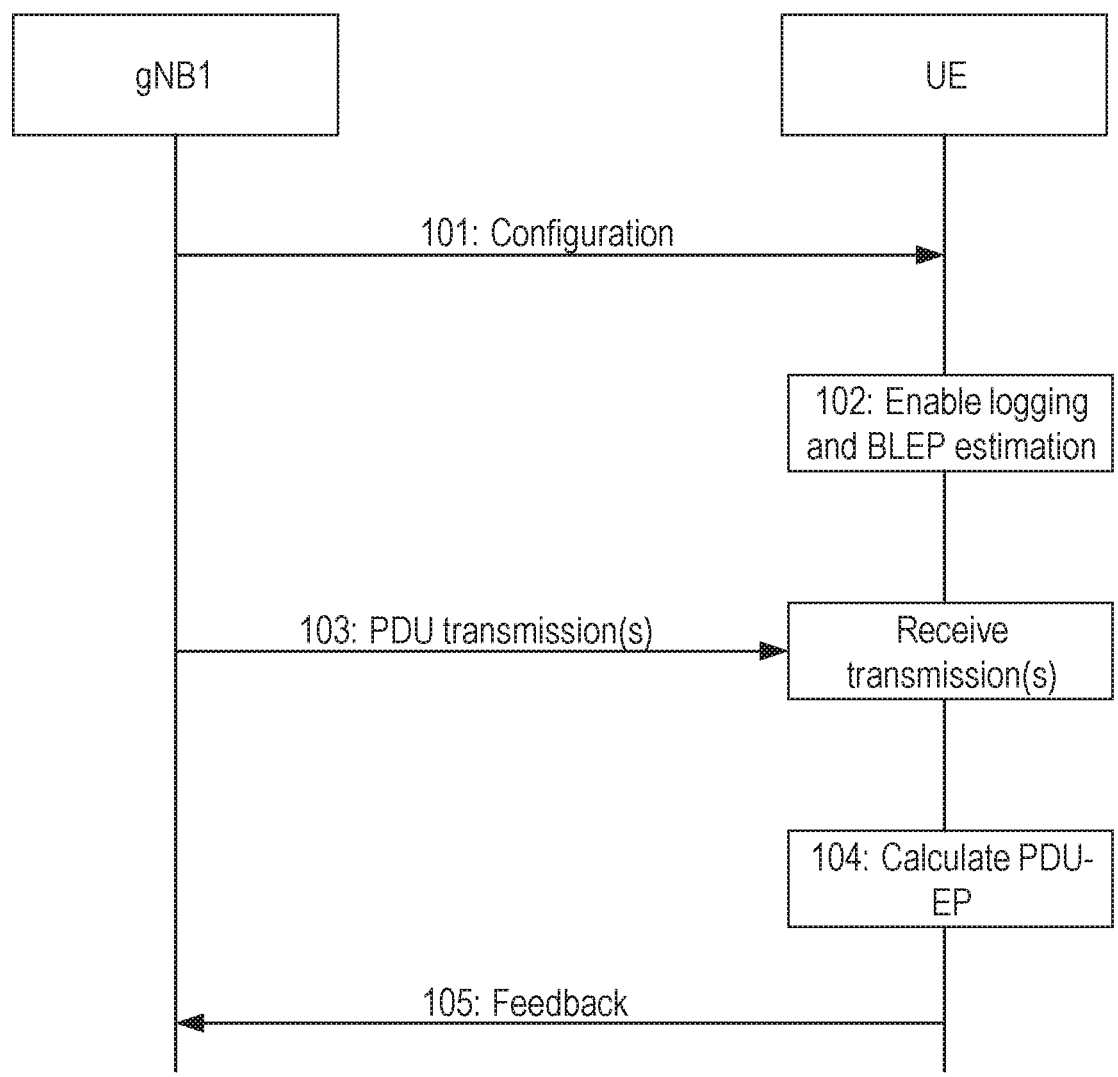
FIG. 1B illustrates an example signaling diagram, according to an embodiment.
Figure 1C:
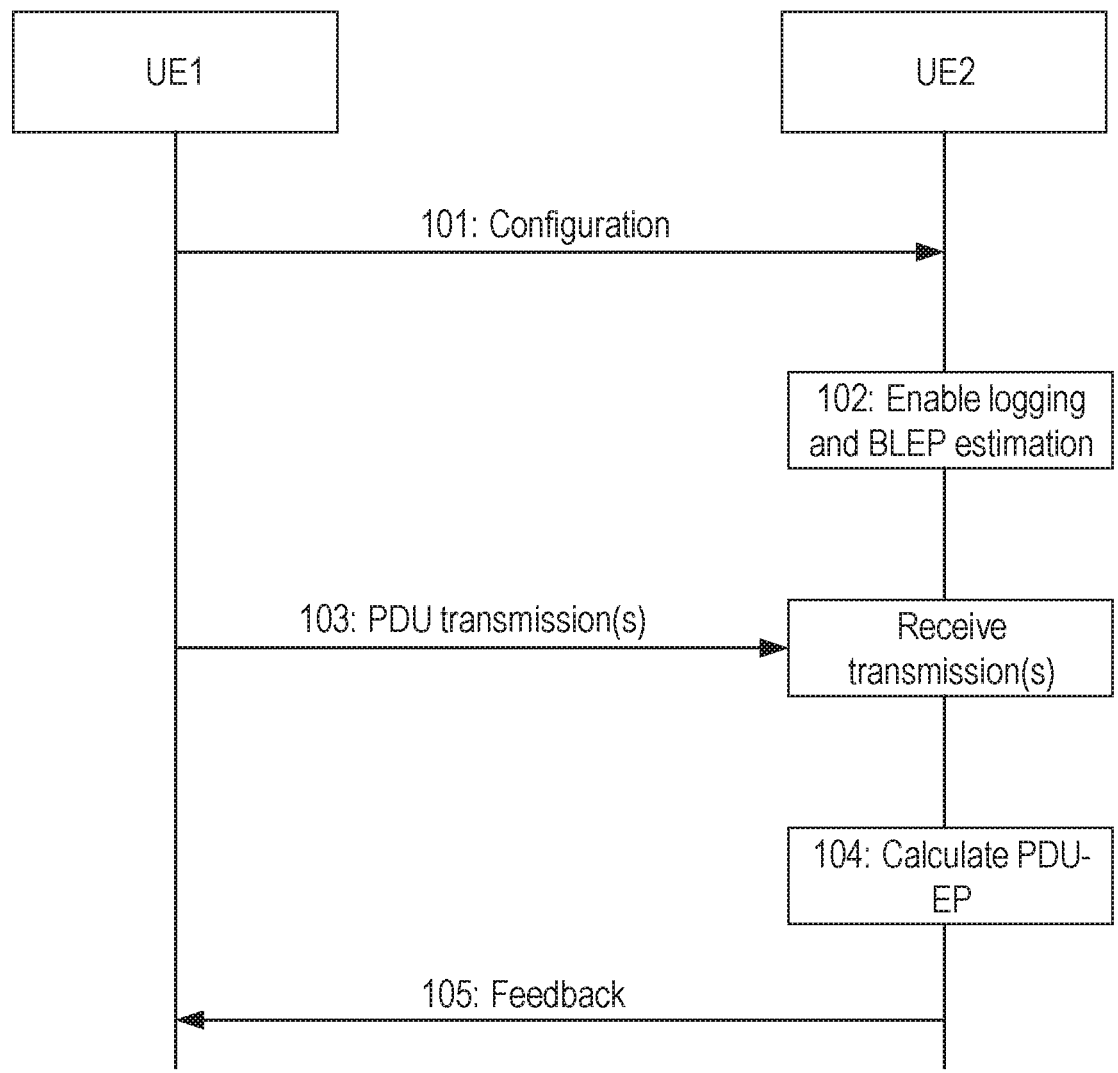
FIG. 1C illustrates an example signaling diagram, according to an embodiment.
Figure 1D:
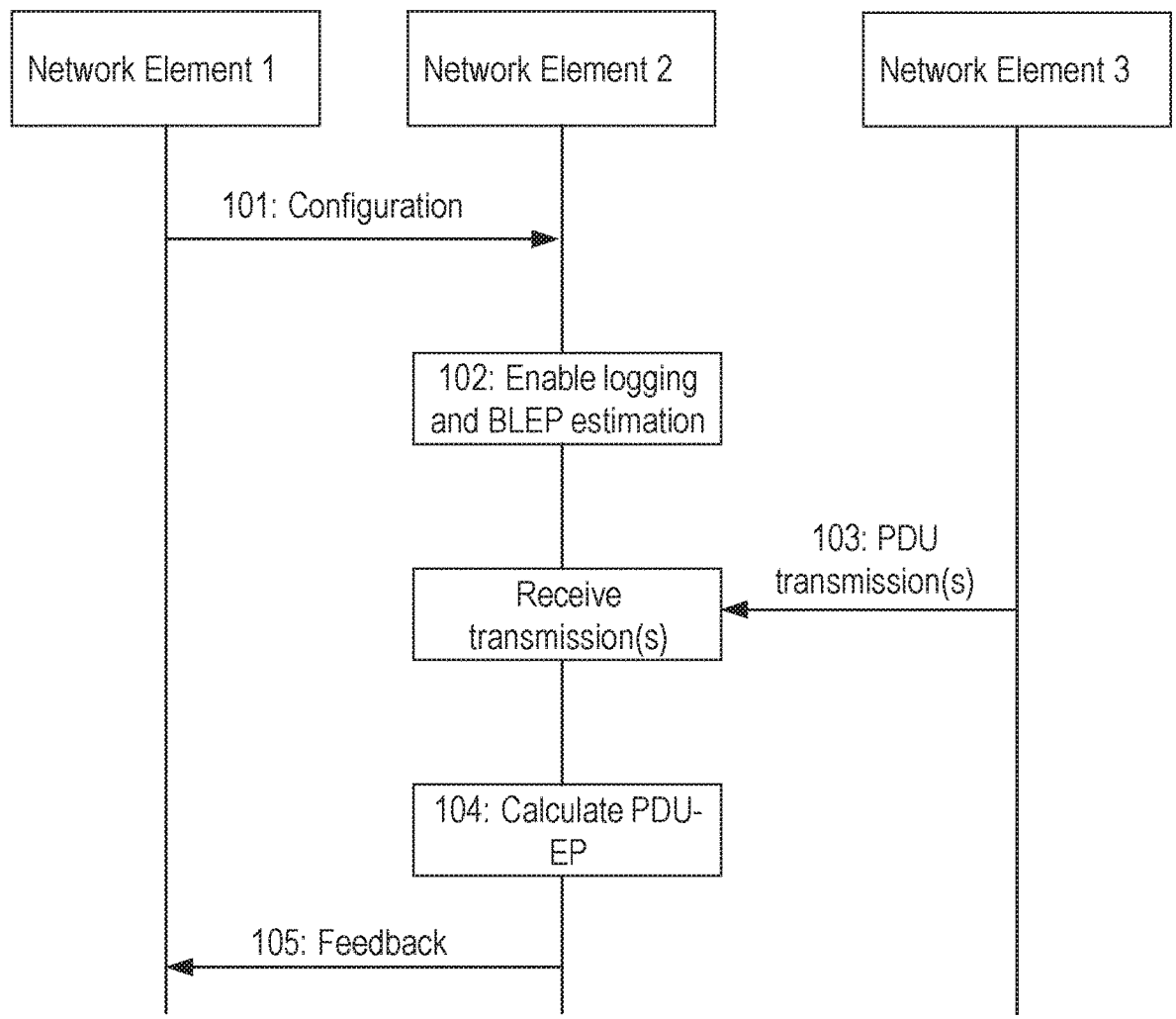
FIG. 1D illustrates an example signaling diagram, according to an embodiment.

FIG. 1A illustrates an example signaling diagram, according to an example embodiment. It is noted that the example of FIG. 1A depicts signaling between a first network element, network element 1, and a second network element, network element 2. According to some embodiments, network element 1 may represent a base station, such as a gNB or eNB, or may represent a UE. Additionally, in certain embodiments, network element 2 may represent a UE. FIG. 1B illustrates another example signaling diagram depicting a downlink case in which network element 1 is represented by gNB1 and network element 2 is represented by a UE. FIG. 1C illustrates yet another example signaling diagram depicting an uplink case in which network element 1 is represented by UE1 and network element 2 is represented by UE2. FIG. 1D illustrates another example signaling diagram according to a multi-connectivity scenario, according to one embodiment.

As illustrated in the example of FIGS. 1A, 1B and 1C, at 101, network element 1 (or gNB1 or UE1) may transmit a configuration to network element 2 (or UE or UE2). In an embodiment, the configuration may include information about PDU-EP calculation and reporting for one or more particular network layers (Lx). For example, in some embodiments, the configuration provided by network element 1 (or gNB1 or UE1) may be a measurement configuration that may include information regarding one or more layer(s) of PDU-EP calculation, one or more specific channel(s) where to compute PDU-EP, such as QoS flow, radio bearer, and/or leg (e.g., radio link control (RLC)-entity). According to an embodiment, the configuration may be provided by network element 1 (or gNB1 or UE1), to network element 2 (or UE or UE2), over radio resource control (RRC).

As further illustrated in the example of FIGS. 1A-1D, at 102, logging and estimation of BLEP may be enabled at network element 2. For example, in response to reception of the configuration, network element 2 (or UE or UE2) may enable BLEP estimation for user-plane CBs and log the BLEP values. Also, in an embodiment, network element 2 (or UE or UE2) may log how the received CBs map to upper layers PDU's at the network layer(s), Lx. In some embodiments, as depicted in FIGS. 1A-1D, at 103, network element 2 (or UE or UE2) may receive one or more PDU transmissions.

According to certain embodiments, at 104, network element 2 (or UE or UE2) may calculate PDU-EP for the network layer(s), Lx. For instance, the calculating of the PDU-EP may include, when network element 2 (or UE or UE2) decodes a user plane PDU matching to the received configuration, using the logged BLEP values and the CB to PDU mapping to calculate the PDU-EP for the network layer(s), Lx, based on the CBs that contributed to the transmission of the PDU. In an embodiment, at 105, network element 2 (or UE or UE2) may report feedback related to the PDU-EP to network element 1 (or gNB1 or UE1).

According to some embodiments, network element 2 (or UE or UE2) may report feedback periodically, for example, based on a fixed time interval or received number of PDUs for the specific layer(s), Lx. In another embodiment, network element 2 (or UE or UE2) may report feedback aperiodically, for example, based on triggers (e.g., upon the occurrence or detection of such triggers), such as a medium access control (MAC)-control element (CE). In yet another embodiment, network element 2 (or UE or UE2) may utilize event-based reporting, such as triggering the feedback reporting based on certain thresholds. Further, in some embodiments, the reporting of feedback may be dynamically switched on or off.

In certain embodiments, the feedback reporting may include one or more of PDU-EP statistics and/or additional information associated with the PDU-EP statistics. For example, PDU-EP statistics may include a single PDU-EP value, statistical value of several PDU-EPs (e.g., mean, percentile, and/or standard), and/or an event indicating that PDU-EP is below or above threshold. According to some examples, the additional information associated with the PDU-EP statistics may include an identifier (ID) of the PDU, such as PDCP sequence number (SN), a channel (e.g., RLC-leg, QoS flow, radio bearer), number of re-transmissions, and/or time difference between reception of duplicate and primary PDCP-PDUs.

In some embodiments, the PDU-EP value can be compressed. For example, in an embodiment, PDU-EP closest to x-nine reliability may be reported: $P=10^{-x}$ that is closest to PDU-EP, e.g., with 4 bits x=0, 1, 2 . . . , 15. According to certain embodiments, PDU-EP can be defined also with threshold y, $P10^{-(x+y)}$, and x can be defined with step size k, e.g., k=2 then x=0, 2, 4, 8, etc. In one embodiment, a single bit may be used to indicate if PDU-EP is above or below the threshold.

FIG. 1D illustrates another example signaling diagram for a multi-connectivity scenario, according to an example embodiment. In the example of FIG. 1D, network element 1 may represent a master gNB, network element 2 may represent a UE, and network element 3 may represent a secondary gNB. The signaling in the example of FIG. 1D may be similar to that of FIG. 1A, however in FIG. 1D the PDU-transmission, at 103, may be from network element 3 that is the secondary gNB and the reporting of secondary gNB PDU-EPs, at 105, may be performed directly to the master gNB.

Figure 2:
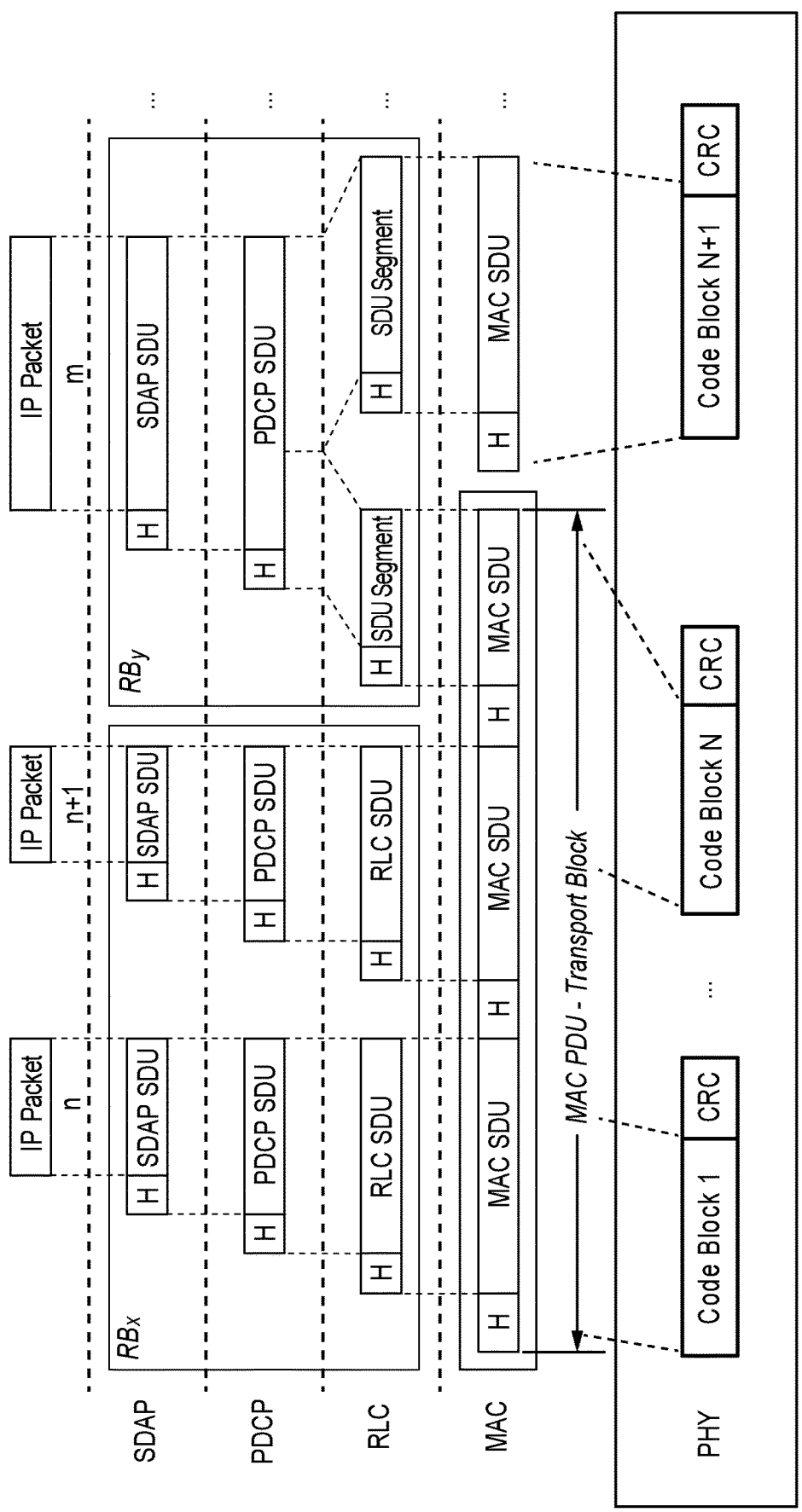
FIG. 2 illustrates an example of the mapping of PDUs from MAC to SDAP and including PHY layer, according to an embodiment.

FIG. 2 illustrates an example of the mapping of PDUs from MAC to SDAP and including PHY layer. According to certain examples, PHY-PDU-EP may be equal to the CB BLEP after hybrid automatic repeat request (HARQ), MAC-PDU-EP may be the error probability of transport block (TB) calculated from the CB BLEPs, and RLC-PDU-EP may be the error probability of MAC-PDU-EPs that contributed to the RLC-PDU transmission.

In some embodiments, PDU-EP on layer n (denoted by $P_n$), may be computed by calculating joint-error-probability of the lower layer (N−1)-PDU-EPs (denoted by $P_{n-1}$). The joint-error-probability may be the same as the inverse probability of all (N−1) PDUs being received successfully, because if one or more (N−1)-PDUs fails, then the N-PDU fails. According to one example, the PDU-EP on layer n may be determined according to the following formula: $P_n = 1 - \Pi_{i=1 \ldots \cancel{c}}(1-P_{n-1}^i)$, where $\cancel{c}$ is the number of (N−1)-PDUs contributed to N-PDU, and i is the index on the subset M. It is noted that, when n is PHY, then $P_{n-1}^i$ are the CB BLEP values after HARQ.

For instance, considering the example of FIG. 2, the PDCP-PDU-EP for the first two IP packets would be equal to the first MAC-PDU-EP or TB error probability. For the third packet, the PDCP-PDU would be joint-error-probability of the two MAC-PDUs that contributed to the transmission.

Figure 3:
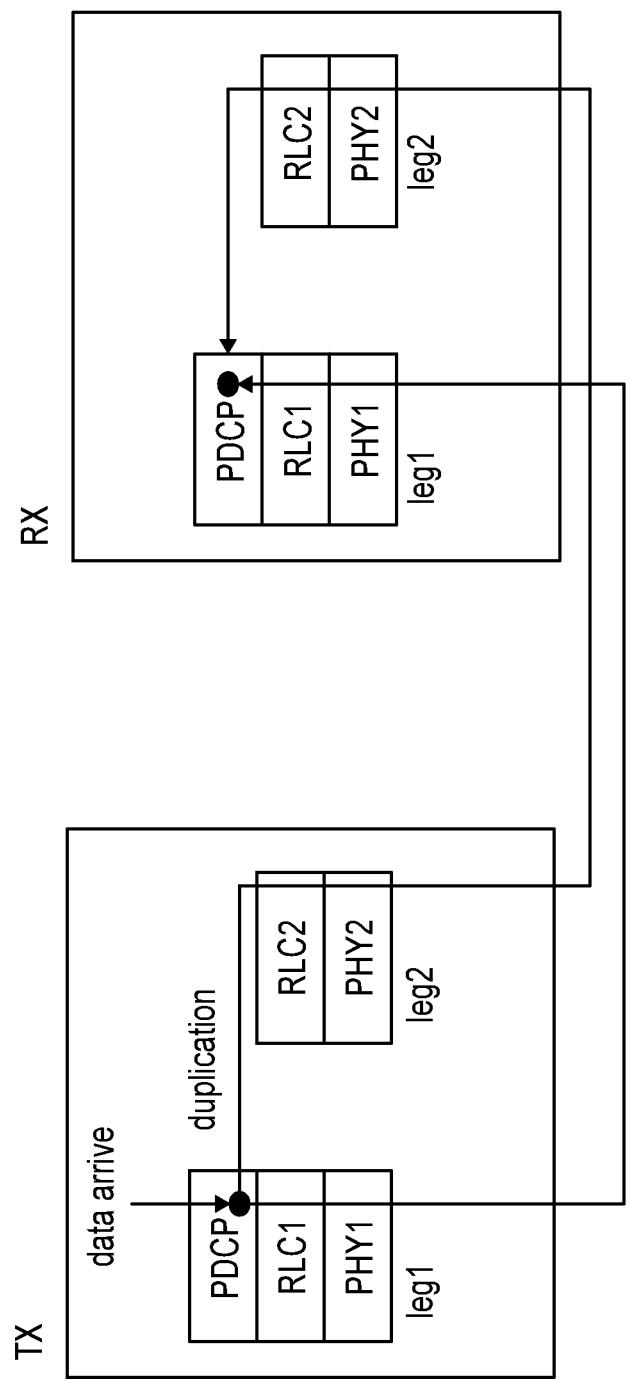
FIG. 3 illustrates an example of PDCP duplication, according to an embodiment.

One example use case of some embodiments may include, but is not limited to, reward calculation for machine learning (ML) based PDCP duplication. FIG. 3 illustrates an example of PDCP duplication, where PDCP-PDU can be duplicated via a second leg (leg2) that can be another component carrier (CC) and/or dual connectivity (DC). Currently, standards support a maximum of 4 legs that can be configured. Duplication increases spatial and time diversity, and typically increases the probability of successfully received PDU. However, duplication may also increase load and interference in the network and, therefore, too frequent duplication can have a negative impact on the overall network performance. It is preferable that unnecessary duplications are avoided, and the necessary duplications are prioritized. However, in URLLC, when the network is already performing with high reliability, but below the reliability target, it is difficult to differentiate the good and bad actions because most of the PDCP-PDU's are received successfully.

Thus, certain embodiments may provide a method of collecting labelled training data for ML based PDCP duplication. Given the current state of the system, a ML model may predict whether a PDCP-PDU be duplicated and on which leg; this prediction may be called an action. The ML model may be built in various ways, and example embodiments may be applicable to various implementations. Independent of the model, the action and state may be associated with a reward/label measuring outcome of the action. When training the ML model, state and action with a positive reward can be used to reinforce certain actions to be more probable, and correspondingly bad actions can be discouraged. In some cases, such as with multi-armed-bandits, the ML model does not necessarily use state and may associate just action and reward.

In the following, examples are considered with two leg duplication as in FIG. 3; however, these examples can be extended to any number of legs. In one example, a UE may be configured to feedback PDCP PDU-EP of both legs. The feedback may be associated with corresponding SN that allows the network to calculate arbitrary label for each duplication decision. This way, the ML algorithm can classify and label actions, even though all PDUs would have been received successfully, helping to steer the algorithm to meet the URLLC reliability goals. Moreover, the feedback may be optimized by providing PDU-EP target for the receiver and to report one bit indicating if the PDU-EP was below or above the target.

According to certain embodiments, a network node, such as a gNB, may configure one or more UE(s) for PDCP-PDU-EP measurement and reporting. In one example, the PDCP-PDU measurement may be performed per leg, which may be denoted by $P_{primary}$ and $P_{secondary}$. A definition of PDCP-PDU-EP threshold, denoted by $P_{target}$, may be provided by the network node to the UE(s). In some embodiments, the network node may also provide the UE(s) with an instruction to compute joint-error probability, e.g., as $P_{total}=P_{primary}*P_{duplicate}$ and/or an instruction to compute the threshold comparison for each PDCP-PDU (True & False), for example: (i) $P_{primary}<P_{target}$, (ii) $P_{secondary}<P_{target}$, (iii) $P_{total}<P_{target}$. In an embodiment, the measurements may be associated with corresponding PDCP SN. In one example, optionally, the time difference, $T_{diff}=T_{primary}-T_{secondary}$, between arrival of primary and secondary PDCP-PDUs may be computed.

In an embodiment, the network node (e.g., gNB) may predict duplication for each PDCP-PDU, and may temporarily store one or more of state (optional), action/duplication decision, and/or sequence number of the PDCP-PDU.

In an embodiment, the UE(s) may feedback PDCP-PDU-EP report(s) to the network node. According to some embodiments, the feedback may include a bitmap of the conditions and associated with PDCP SN. In one example embodiment, the feedback reporting may be without PDCP SN and the report(s) may be ordered by sequence number. Therefore, the transmitter can map the reports to corresponding SN. In some instances, the report may include the SN to help synchronize the mapping. Optionally, in an embodiment, $T_{diff}$ can be reported that is useful with DC. The delay of a secondary leg may be also obtained through Xn interface, but measuring it in UE may be more efficient. In an embodiment, the reporting may be performed with n-bits. Table 1 below illustrates an example of PDCP-PDU-EP reporting for ML based PDCP duplication. For example, in Table 1, $T_{diff}=[-3, -2, -1, 0, 1, 2, 3, 4]$ may be reported with 3 bits denoting the time difference in transmission time intervals (TTIs) or milliseconds.

TABLE 1

|  | $P_{primary} < P_{target}$ | $P_{secondary} < P_{target}$ | $P_{total} < P_{target}$ | PDCP SN | $T_{diff}$ (optional) |
| --- | --- | --- | --- | --- | --- |
| report 1 | 1 | 1 | 1 | 100000 | 001 |
| report 2 | 1 | 0 | 1 | 100001 | 000 |
| report 3 | 0 | 0 | 0 | 100010 | 100 |
|  | 1 | 0 | 0 | 100011 | 001 |

Figures 4A, 4B:
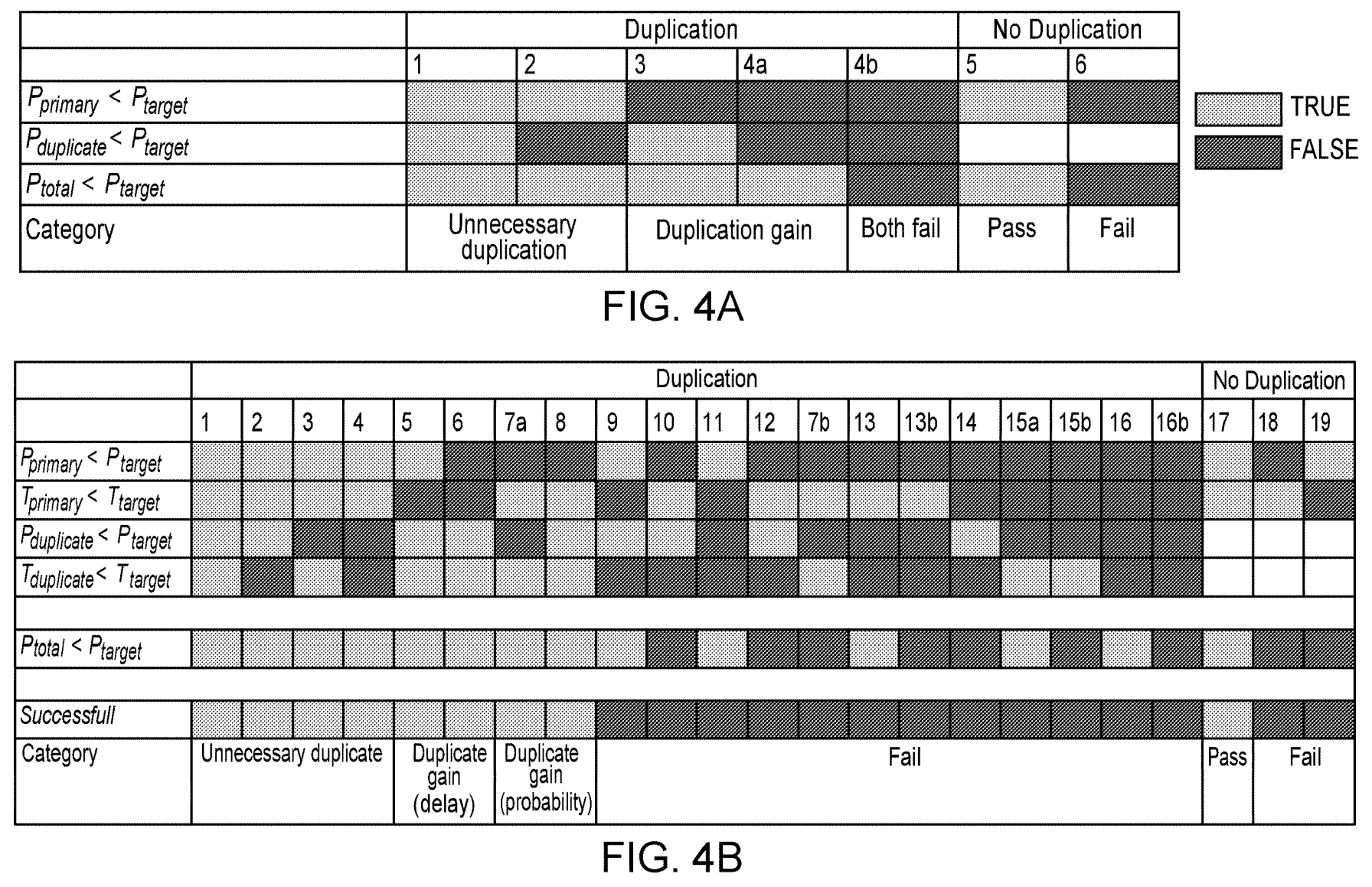

In some embodiments, the reported PDCP-PDU-EPs may be used to classify the actions. FIG. 4A illustrates an example table of the classification of actions based on the PDCP-PDU-EP feedback. For instance, as shown in column 6 of FIG. 4A, even though the PDCP-PDU was received correctly it can be classified as failure if the PDCP-PDU-EP was meeting the target. Respectively, in columns 1 & 2 of FIG. 4A, if the primary PDCP-PDU was received with sufficient PDCP-PDU-EP, the duplicate PDCP-PDU was obsolete and, therefore, this action can be labelled as unnecessary duplication. When the primary PDCP-PDU-EP is higher than the threshold, in columns 3 and 4a of FIG. 4A, but the joint-error probability is below the target, the duplication was needed and, thus, this behavior can be encouraged. In this way, after each PDCP-PDU-EP feedback, the ML policy can be steered in the desired direction, without collecting a large number of samples to decide goodness of the actions. According to certain embodiments, if the transmitter can measure delay of PDCP-PDU, e.g., by enabling the optional time difference reporting, the classification can be implemented to consider probability and delay requirements. FIG. 4B illustrates a table depicting an example of classification by considering reliability and delay target, according to an example embodiment.

According to an embodiment, a label for the action may be determined based on the classification. While the ML-model training can be done in numerous ways, in one example referring to FIG. 4A, a reward of +1 may be assigned for categories 3, 4a and 5, and −1 may be assigned otherwise. This will encourage the ML-model to just perform duplication when it is needed thereby improving spectral efficiency and decreasing the need for duplication, since less interference is generated.

Figure 5A:
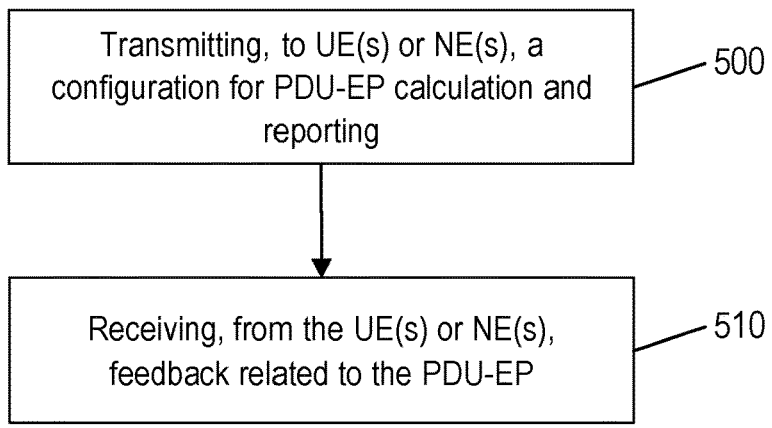
FIG. 5A illustrates an example flow diagram of a method, according to an embodiment.

FIG. 5A illustrates an example flow diagram of a method for error probability feedback, according to one example embodiment. In certain example embodiments, the flow diagram of FIG. 5A may be performed by a network entity or network node associated with a communication system, such as LTE or 5G NR. For instance, in some example embodiments, the network node performing the method of FIG. 5A may include a base station, eNB, gNB, and/or NG-RAN node. Additionally or alternatively, in certain embodiments, the network node performing the method of FIG. 5A may include a UE, mobile device, mobile station, IoT device, or the like. For example, in some embodiments, the method of FIG. 5A may be performed by network element 1 of FIG. 1A or FIG. 1D, gNB1 of FIG. 1B, and/or UE1 of FIG. 1C, as discussed above.

As illustrated in the example of FIG. 5A, the method may include, at 500, transmitting, to at least one UE or network element, a configuration for PDU-EP calculation and reporting. In some embodiments, the configuration may include an indication of a network layer for the PDU-EP calculation, and/or an indication of a specific channel, quality of service flow, radio bearer, and/or leg for the PDU-EP calculation. In an embodiment, the configuration may be transmitted to the at least one UE over RRC. According to one embodiment, the configuration may include a target threshold for the PDU-EP. In some embodiments, the method may include transmitting one or more PDUs to the at least one UE.

According to an embodiment, the method of FIG. 5A may also include, at 510, receiving, from the at least one UE or network element, feedback related to the PDU-EP. In some embodiments, the receiving 510 may include receiving the feedback periodically based on a fixed time interval or received number of PDUs, for example. In another embodiment, the receiving 510 may include receiving the feedback aperiodically based, for example, on triggers. In yet another embodiment, the receiving 510 may include receiving the feedback based on meeting certain thresholds. According to one embodiment, the feedback may be dynamically switched on or off.

In certain embodiments, the feedback may include PDU-EP statistics, such as a single PDU-EP value, a statistical value of a plurality of PDU-EPs, and/or an event indicating a PDU-EP is below or above a certain threshold. According to some embodiments, the feedback may include additional information associated with the PDU-EP statistics, such as an identifier of the PDU, an indication of the channel where the PDU error probability was computed, an indication of a number of retransmission for the PDU, and/or an indication of a time difference between reception of a duplicate and primary PDCP PDU. In one embodiment, the feedback may include a single bit indicating whether the protocol data unit error probability is above or below the target threshold.

According to one embodiment, the example of FIG. 5A may be applicable to a PDCP duplication scenario. In such an embodiment, the transmitting 500 may include configuring the at least one UE for PDCP PDU-EP measurement and reporting. In an embodiment, the configuring of the at least one UE for the PDCP PDU-EP measurement and reporting may include one or more of: providing instructions to perform the PDCP PDU-EP measurement per leg, providing a definition of a threshold for the PDCP PDU-EP measurement, providing instructions to compute a joint error probability for each leg, providing instructions to compute the threshold comparison for each PDCP PDU, and/or providing instructions to associate the PDCP PDU-EP measurement with a corresponding PDCP sequence number. Then, in some embodiments, the method may include predicting duplication for each PDCP PDU, and temporarily storing a prediction of whether a PDCP PDU should be duplicated, a decision on whether to duplicate the PDCP PDU, and/or a sequence number of the PDCP PDU. According to certain embodiments, the method may also include receiving a PDCP PDU-EP report, using the PDCP PDU-EP report to classify the prediction of whether a PDCP PDU should be duplicated, and determining a label for the prediction based on the classification. In an embodiment, the determined label may be used to train a ML model to perform PDCP duplication when the duplication is needed, and avoid unnecessary duplications.

Figure 5B:
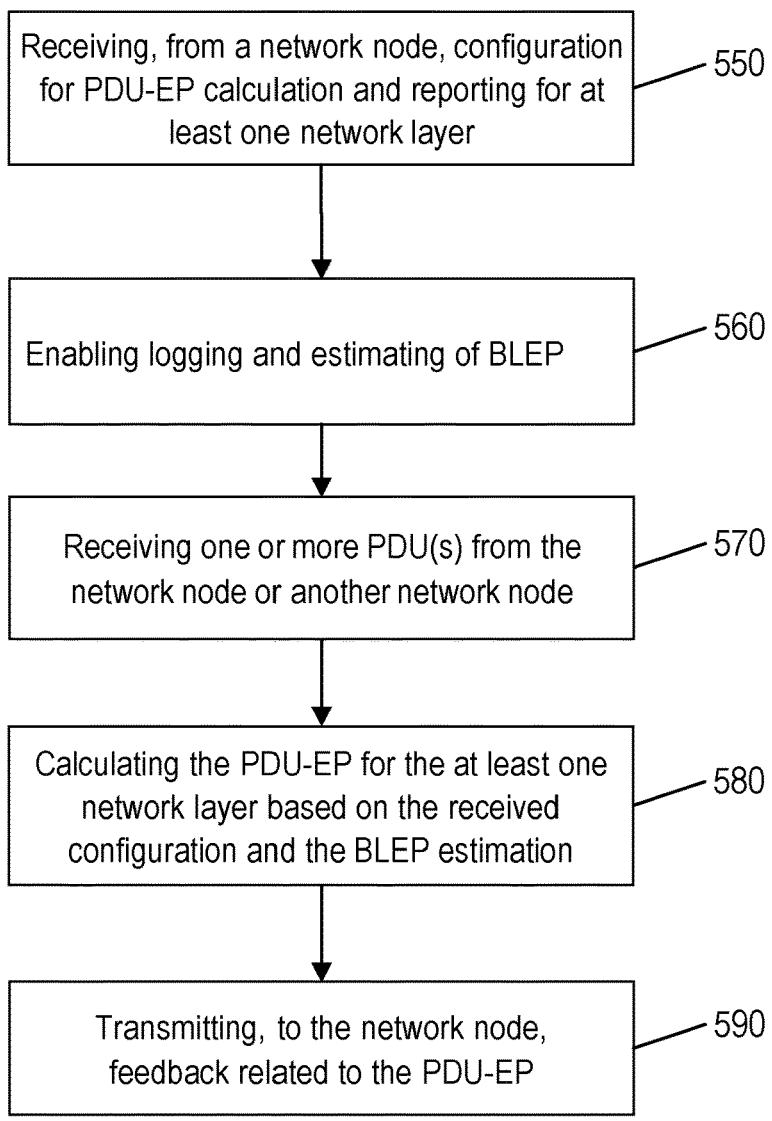
FIG. 5B illustrates an example flow diagram of a method, according to an embodiment.

FIG. 5B illustrates an example flow diagram of a method for error probability feedback, according to one example embodiment. In certain example embodiments, the flow diagram of FIG. 5B may be performed by a network entity or network node associated with a communications system, such as LTE or 5G NR. For instance, in some example embodiments, the network entity performing the method of FIG. 5B may include a UE, mobile device, mobile station, IoT device, or the like. For example, in some embodiments, the method of FIG. 5B may be performed by network element 2 of FIG. 1A or FIG. 1D, UE of FIG. 1B, and/or UE2 of FIG. 1C, as discussed above.

In an embodiment, the method of FIG. 5B may include, at 550, receiving, from a network node, configuration for PDU-EP calculation and reporting for at least one network layer. In some embodiments, the configuration may include an indication of a network layer for the PDU-EP calculation, and/or an indication of a specific channel, quality of service flow, radio bearer, and/or leg for the PDU-EP calculation. In an embodiment, the configuration may be received from the network node over RRC. According to one embodiment, the configuration may include a target threshold for the PDU-EP.

According to one embodiment, the method may also include, at 560, enabling logging and estimating of BLEP. For example, in an embodiment, the enabling 560 may include enabling BLEP estimation for one or more user plane CBs and logging the BLEP values. In one embodiment, the enabling 560 may also include the logging of a mapping of user plane CBs to upper layer PDUs at the at least one network layer.

In some embodiments, the method of FIG. 5B may include, at 570, receiving one or more PDU(s) from the network node or another network node. According to certain embodiments, the method of FIG. 5B may include, at 580, calculating the PDU-EP for the at least one network layer based on the received configuration and the BLEP estimation. According to certain embodiments, the calculating 580 may include, when a PDU is decoded that matches to the received configuration, using the logged BLEP values and the mapping of the user plane CBs to the upper layer PDUs to calculate the PDU-EP for the at least one network layer based on CBs that contributed to transmission of the PDU.

In one embodiment, the calculating 580 may include computing the PDU-EP by calculating a joint error probability of a layer immediately lower than the at least one network layer. For example, if the PDU-EP on the at least one layer is denoted as $P_n$, the PDU-EP may be computed by calculating joint error probability of the lower layer (N−1)-PDU-EPs denoted by $P_{n-1}$. Then, according to one example, the PDU-EP on the at least one layer may be determined according to the following formula: $P_n = 1 - \Pi_{i=1 \ldots M}(1 - P_{n-1}{}^i)$, where M is the number of (N−1)-PDUs contributed to N-PDU, and i is the index on the subset M.

According to certain embodiments, the method of FIG. 5B may further include, at 590, transmitting, to the network node, feedback related to the PDU-EP. For example, in certain embodiments, the feedback may be transmitted periodically based on a fixed time interval or received number of PDUs, the feedback may be transmitted aperiodically based on triggers, and/or the feedback may be transmitted based on meeting certain thresholds.

In some embodiments, the feedback may include one or more of: a single PDU-EP value, a statistical value of a plurality of PDU-Eps, an event indicating PDU-EP is below or above a certain threshold, an identifier of the PDU, an indication of the channel where the PDU-EP was computed, an indication of a number of retransmission for the PDU, and/or an indication of a time difference between reception of a duplicate and primary PDCP PDU. In an embodiment, when the configuration includes a target threshold for the PDU-EP, the feedback may include a single bit indicating whether the PDU-EP is above or below the target threshold. It is noted that, in certain embodiments, the transmission of the feedback may be dynamically switched on or off.

As mentioned above, some embodiments may be applicable to a PDCP duplication scenario. In such example embodiments, the receiving 550 may include receiving a configuration for PDCP PDU-EP measurement and reporting. According to an embodiment, the configuration for the PDCP PDU-EP measurement and reporting may include one or more of: instructions to perform the PDCP PDU-EP measurement per leg, a definition of a threshold for the PDCP PDU-EP measurement, instructions to compute a joint error probability for each of the legs, instructions to compute the threshold comparison for each PDCP PDU, and/or instructions to associate the PDCP PDU-EP measurement with a corresponding PDCP sequence number. In some embodiments, the transmitting 290 may include transmitting, to the network node, a PDCP PDU-EP report.

Figure 6A:
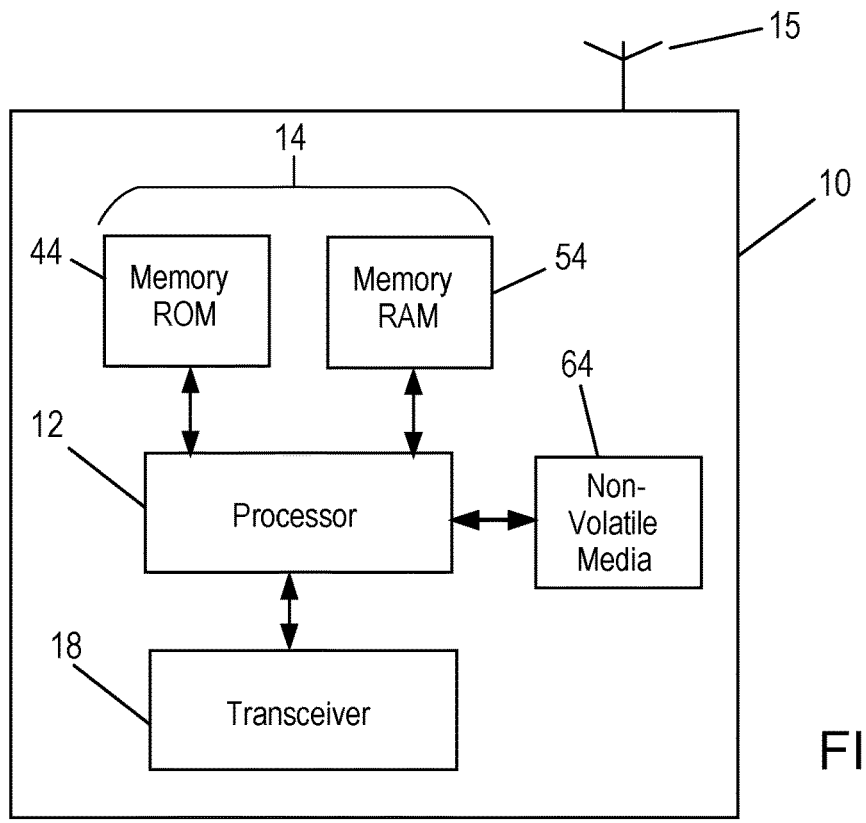
FIG. 6A illustrates an example block diagram of an apparatus, according to an embodiment.

FIG. 6A illustrates an example of an apparatus 10 according to an embodiment. In an embodiment, apparatus 10 may be a node, host, or server in a communications network or serving such a network. For example, apparatus 10 may be a satellite, base station, a Node B, an evolved Node B (eNB), 5G Node B or access point, next generation Node B (NG-NB or gNB), and/or WLAN access point, associated with a radio access network, such as a LTE network, 5G or NR. In example embodiments, apparatus 10 may be NG-RAN node, an eNB in LTE, or gNB in 5G. In other example embodiments, apparatus 10 may be a UE, mobile device, mobile station, IoT device, or the like.

It should be understood that, in some example embodiments, apparatus 10 may be comprised of an edge cloud server as a distributed computing system where the server and the radio node may be stand-alone apparatuses communicating with each other via a radio path or via a wired connection, or they may be located in a same entity communicating via a wired connection. For instance, in certain example embodiments where apparatus 10 represents a gNB, it may be configured in a central unit (CU) and distributed unit (DU) architecture that divides the gNB functionality. In such an architecture, the CU may be a logical node that includes gNB functions such as transfer of user data, mobility control, radio access network sharing, positioning, and/or session management, etc. The CU may control the operation of DU(s) over a front-haul interface. The DU may be a logical node that includes a subset of the gNB functions, depending on the functional split option. It should be noted that one of ordinary skill in the art would understand that apparatus 10 may include components or features not shown in FIG. 6A.

As illustrated in the example of FIG. 6A, apparatus 10 may include a processor 12 for processing information and executing instructions or operations. Processor 12 may be any type of general or specific purpose processor. In fact, processor 12 may include one or more of general-purpose computers, special purpose computers, microprocessors, digital signal processors (DSPs), field-programmable gate arrays (FPGAs), application-specific integrated circuits (ASICs), and processors based on a multi-core processor architecture, as examples. While a single processor 12 is shown in FIG. 6A, multiple processors may be utilized according to other embodiments. For example, it should be understood that, in certain embodiments, apparatus 10 may include two or more processors that may form a multiprocessor system (e.g., in this case processor 12 may represent a multiprocessor) that may support multiprocessing. In certain embodiments, the multiprocessor system may be tightly coupled or loosely coupled (e.g., to form a computer cluster).

Processor 12 may perform functions associated with the operation of apparatus 10, which may include, for example, precoding of antenna gain/phase parameters, encoding and decoding of individual bits forming a communication message, formatting of information, and overall control of the apparatus 10, including processes related to management of communication resources.

Apparatus 10 may further include or be coupled to a memory 14 (internal or external), which may be coupled to processor 12, for storing information and instructions that may be executed by processor 12. Memory 14 may be one or more memories and of any type suitable to the local application environment, and may be implemented using any suitable volatile or nonvolatile data storage technology such as a semiconductor-based memory device, a magnetic memory device and system, an optical memory device and system, fixed memory, and/or removable memory. For example, memory 14 can be comprised of any combination of random access memory (RAM) 54, read only memory (ROM) 44, static storage such as a magnetic or optical disk, hard disk drive (HDD), or any other type of non-transitory machine or computer readable media. For example, in an embodiment, apparatus 10 may include a non-volatile media 64. In an embodiment, non-volatile media 64 may be a removable media. Memory 14 and/or media 64 may store software, computer program code or instructions. The instructions stored in memory 14 or media 64 may include program instructions or computer program code that, when executed by processor 12, enable the apparatus 10 to perform tasks as described herein.

In an embodiment, apparatus 10 may further include or be coupled to (internal or external) a drive or port that is configured to accept and read an external computer readable storage medium, such as an optical disc, USB drive, flash drive, or any other storage medium. For example, the external computer readable storage medium may store a computer program or software for execution by processor 12 and/or apparatus 10.

In some embodiments, apparatus 10 may also include or be coupled to one or more antennas 15 for transmitting and receiving signals and/or data to and from apparatus 10. Apparatus 10 may further include or be coupled to a transceiver 18 configured to transmit and receive information. The transceiver 18 may include, for example, a plurality of radio interfaces that may be coupled to the antenna(s) 15. The radio interfaces may correspond to a plurality of radio access technologies including one or more of GSM, NB-IoT, LTE, 5G, WLAN, Bluetooth, BT-LE, NFC, radio frequency identifier (RFID), ultrawideband (UWB), MulteFire, and the like. The radio interface may include components, such as filters, converters (for example, digital-to-analog converters and the like), mappers, a Fast Fourier Transform (FFT) module, and the like, to generate symbols for a transmission via one or more downlinks and to receive symbols (for example, via an uplink).

As such, transceiver 18 may be configured to modulate information on to a carrier waveform for transmission by the antenna(s) 15 and demodulate information received via the antenna(s) 15 for further processing by other elements of apparatus 10. In other embodiments, transceiver 18 may be capable of transmitting and receiving signals or data directly. Additionally or alternatively, in some embodiments, apparatus 10 may include an input and/or output device (I/O device).

In an embodiment, memory 14 may store software modules that provide functionality when executed by processor 12. The modules may include, for example, an operating system that provides operating system functionality for apparatus 10. The memory may also store one or more functional modules, such as an application or program, to provide additional functionality for apparatus 10. The components of apparatus 10 may be implemented in hardware, or as any suitable combination of hardware and software.

According to some embodiments, processor 12 and memory 14 may be included in or may form a part of processing circuitry or control circuitry. In addition, in some embodiments, transceiver 18 may be included in or may form a part of transceiver circuitry.

As used herein, the term "circuitry" may refer to hardware-only circuitry implementations (e.g., analog and/or digital circuitry), combinations of hardware circuits and software, combinations of analog and/or digital hardware circuits with software/firmware, any portions of hardware processor(s) with software (including digital signal processors) that work together to case an apparatus (e.g., apparatus 10) to perform various functions, and/or hardware circuit(s) and/or processor(s), or portions thereof, that use software for operation but where the software may not be present when it is not needed for operation. As a further example, as used herein, the term "circuitry" may also cover an implementation of merely a hardware circuit or processor (or multiple processors), or portion of a hardware circuit or processor, and its accompanying software and/or firmware. The term circuitry may also cover, for example, a baseband integrated circuit in a server, cellular network node or device, or other computing or network device.

As introduced above, in certain embodiments, apparatus 10 may be a network node or RAN node, such as a base station, access point, Node B, eNB, gNB, WLAN access point, or the like. In other example embodiments, apparatus 10 may be a UE, mobile device, mobile station, IoT device, or the like. For example, in some embodiments, apparatus 10 may be configured to perform one or more of the processes depicted in any of the flow charts or signaling diagrams described herein, such as those illustrated in FIG. 1A, 1B, 1C, 1D, 3, 5A or 5B. In some embodiments, as discussed herein, apparatus 10 may be configured to perform a procedure relating to error probability feedback.

According to certain embodiments, apparatus 10 may be controlled by memory 14 and processor 12 to transmit, to at least one UE, a configuration for PDU-EP calculation and reporting. In some embodiments, the configuration may include an indication of a network layer for the PDU-EP calculation, and/or an indication of a specific channel, quality of service flow, radio bearer, and/or leg for the PDU-EP calculation. In an embodiment, the configuration may be transmitted to the at least one UE over RRC. According to one embodiment, the configuration may include a target threshold for the PDU-EP. In some embodiments, the method may include transmitting one or more PDUs to the at least one UE.

According to an embodiment, apparatus 10 may be controlled by memory 14 and processor 12 to receive, from the at least one UE, feedback related to the PDU-EP. In some embodiments, the feedback may be received periodically based on a fixed time interval or received number of PDUs, for example. In another embodiment, the feedback may be received aperiodically based, for example, on triggers. In yet another embodiment, the feedback may be received based on meeting certain thresholds. According to one embodiment, the feedback may be dynamically switched on or off.

In certain embodiments, the feedback may include PDU-EP statistics, such as a single PDU-EP value, a statistical value of a plurality of PDU-EPs, and/or an event indicating PDU-EP is below or above a certain threshold. According to some embodiments, the feedback may include additional information associated with the PDU-EP statistics, such as an identifier of the PDU, an indication of the channel where the PDU error probability was computed, an indication of a number of retransmission for the PDU, and/or an indication of a time difference between reception of a duplicate and primary PDCP PDU. In one embodiment, the feedback may include a single bit indicating whether the protocol data unit error probability is above or below the target threshold.

As mentioned above, some embodiments may be applicable to a PDCP duplication scenario. In such example embodiments, apparatus 10 may be controlled by memory 14 and processor 12 to configure the at least one UE for PDCP PDU-EP measurement and reporting. In an embodiment, apparatus 10 may be controlled by memory 14 and processor 12 to configure the at least one UE for the PDCP PDU-EP measurement and reporting by one or more of: providing instructions to perform the PDCP PDU-EP measurement per leg, providing a definition of a threshold for the PDCP PDU-EP measurement, providing instructions to compute a joint error probability for each leg, providing instructions to compute the threshold comparison for each PDCP PDU, and/or providing instructions to associate the PDCP PDU-EP measurement with a corresponding PDCP sequence number. Then, in some embodiments, apparatus 10 may be controlled by memory 14 and processor 12 to predict duplication for each PDCP PDU, and temporarily store a prediction of whether a PDCP PDU should be duplicated, a decision on whether to duplicate the PDCP PDU, and/or a sequence number of the PDCP PDU. According to certain embodiments, apparatus 10 may be controlled by memory 14 and processor 12 to receive a PDCP PDU-EP report, use the PDCP PDU-EP report to classify the prediction of whether a PDCP PDU should be duplicated, and/or determine a label for the prediction based on the classification. In an embodiment, apparatus 10 may be controlled by memory 14 and processor 12 to configure utilize the determined label to train a ML model to perform PDCP duplication when the duplication is needed, and thereby avoid unnecessary duplications.

Figure 6B:
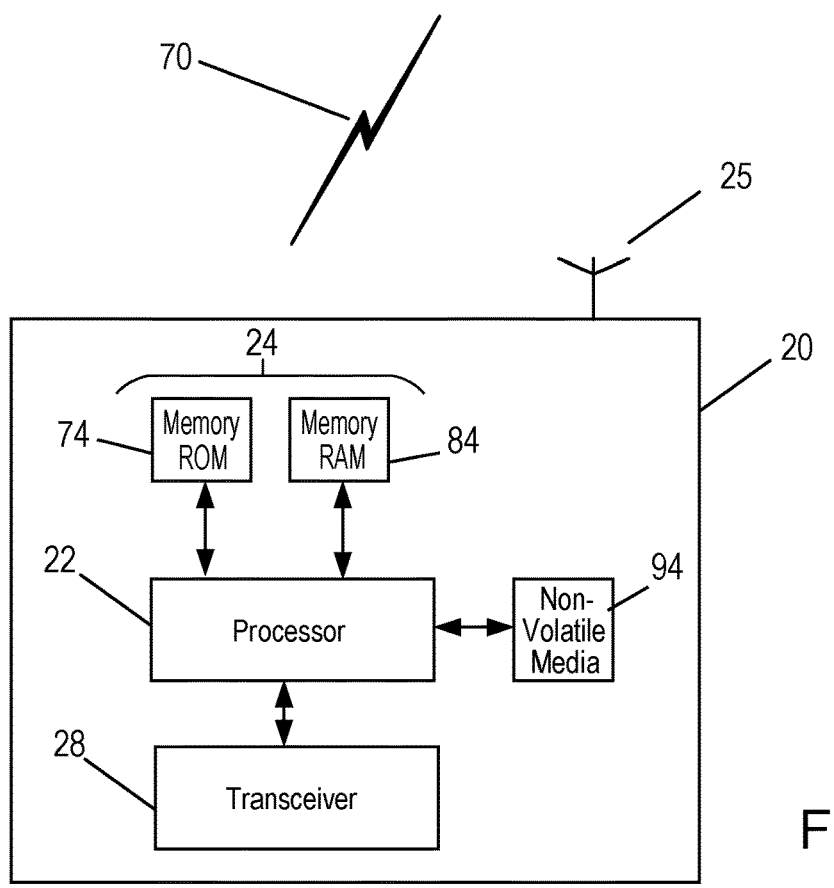
FIG. 6B illustrates an example block diagram of an apparatus, according to an embodiment.

FIG. 6B illustrates an example of an apparatus 20 according to another embodiment. In an embodiment, apparatus 20 may be a node or element in a communications network or associated with such a network, such as a UE, mobile equipment (ME), mobile station, mobile device, stationary device, IoT device, or other device. As described herein, UE may alternatively be referred to as, for example, a mobile station, mobile equipment, mobile unit, mobile device, user device, subscriber station, wireless terminal, tablet, smart phone, IoT device, sensor or NB-IoT device, or the like. As one example, apparatus 20 may be implemented in, for instance, a wireless handheld device, a wireless plug-in accessory, or the like.

In some example embodiments, apparatus 20 may include one or more processors, one or more computer-readable storage medium (for example, memory, storage, or the like), one or more radio access components (for example, a modem, a transceiver, or the like), and/or a user interface. In some embodiments, apparatus 20 may be configured to operate using one or more radio access technologies, such as GSM, LTE, LTE-A, NR, 5G, WLAN, WiFi, NB-IoT, Bluetooth, NFC, MulteFire, and/or any other radio access technologies. It should be noted that one of ordinary skill in the art would understand that apparatus 20 may include components or features not shown in FIG. 6B.

As illustrated in the example of FIG. 6B, apparatus 20 may include or be coupled to a processor 22 for processing information and executing instructions or operations. Processor 22 may be any type of general or specific purpose processor. In fact, processor 22 may include one or more of general-purpose computers, special purpose computers, microprocessors, digital signal processors (DSPs), field-programmable gate arrays (FPGAs), application-specific integrated circuits (ASICs), and processors based on a multi-core processor architecture, as examples. While a single processor 22 is shown in FIG. 6B, multiple processors may be utilized according to other embodiments. For example, it should be understood that, in certain embodiments, apparatus 20 may include two or more processors that may form a multiprocessor system (e.g., in this case processor 22 may represent a multiprocessor) that may support multiprocessing. In certain embodiments, the multiprocessor system may be tightly coupled or loosely coupled (e.g., to form a computer cluster).

Processor 22 may perform functions associated with the operation of apparatus 20 including, as some examples, precoding of antenna gain/phase parameters, encoding and decoding of individual bits forming a communication message, formatting of information, and overall control of the apparatus 20, including processes related to management of communication resources.

Apparatus 20 may further include or be coupled to a memory 24 (internal or external), which may be coupled to processor 22, for storing information and instructions that may be executed by processor 22. Memory 24 may be one or more memories and of any type suitable to the local application environment, and may be implemented using any suitable volatile or nonvolatile data storage technology such as a semiconductor-based memory device, a magnetic memory device and system, an optical memory device and system, fixed memory, and/or removable memory. For example, memory 24 can be comprised of any combination of random access memory (RAM) 84, read only memory (ROM) 74, static storage such as a magnetic or optical disk, hard disk drive (HDD), or any other type of non-transitory machine or computer readable media. For example, in an embodiment, apparatus 20 may include a non-volatile media 94. In an embodiment, non-volatile media 94 may be a removable media. Memory 24 and/or media 94 may store software, computer program code or instructions. The instructions stored in memory 24 or media 94 may include program instructions or computer program code that, when executed by processor 22, enable the apparatus 20 to perform tasks as described herein.

In an embodiment, apparatus 20 may further include or be coupled to (internal or external) a drive or port that is configured to accept and read an external computer readable storage medium, such as an optical disc, USB drive, flash drive, or any other storage medium. For example, the external computer readable storage medium may store a computer program or software for execution by processor 22 and/or apparatus 20.

In some embodiments, apparatus 20 may also include or be coupled to one or more antennas 25 for receiving a downlink signal and for transmitting via an uplink from apparatus 20. Apparatus 20 may further include a transceiver 28 configured to transmit and receive information. The transceiver 28 may also include a radio interface (e.g., a modem) coupled to the antenna 25. The radio interface may correspond to a plurality of radio access technologies including one or more of GSM, LTE, LTE-A, 5G, NR, WLAN, NB-IoT, Bluetooth, BT-LE, NFC, RFID, UWB, and the like. The radio interface may include other components, such as filters, converters (for example, digital-to-analog converters and the like), symbol demappers, signal shaping components, an Inverse Fast Fourier Transform (IFFT) module, and the like, to process symbols, such as OFDMA symbols, carried by a downlink or an uplink.

For instance, transceiver 28 may be configured to modulate information on to a carrier waveform for transmission by the antenna(s) 25 and demodulate information received via the antenna(s) 25 for further processing by other elements of apparatus 20. In other embodiments, transceiver 28 may be capable of transmitting and receiving signals or data directly. Additionally or alternatively, in some embodiments, apparatus 20 may include an input and/or output device (I/O device). In certain embodiments, apparatus 20 may further include a user interface, such as a graphical user interface or touchscreen.

In an embodiment, memory 24 stores software modules that provide functionality when executed by processor 22. The modules may include, for example, an operating system that provides operating system functionality for apparatus 20. The memory may also store one or more functional modules, such as an application or program, to provide additional functionality for apparatus 20. The components of apparatus 20 may be implemented in hardware, or as any suitable combination of hardware and software. According to an example embodiment, apparatus 20 may optionally be configured to communicate with apparatus 10 via a wireless or wired communications link 70 according to any radio access technology, such as NR.

According to some embodiments, processor 22 and memory 24 may be included in or may form a part of processing circuitry or control circuitry. In addition, in some embodiments, transceiver 28 may be included in or may form a part of transceiving circuitry.

As discussed above, according to some embodiments, apparatus 20 may be a UE, mobile device, mobile station, ME, IoT device and/or NB-IoT device, for example. According to certain embodiments, apparatus 20 may be controlled by memory 24 and processor 22 to perform the functions associated with example embodiments described herein. For example, in some embodiments, apparatus 20 may be configured to perform one or more of the processes depicted in any of the flow charts or signaling diagrams described herein, such as those illustrated in FIG. 1A, 1B, 1C, 1D, 3, 5A or 5B. In certain embodiments, apparatus 20 may include or represent a UE and may be configured to perform a procedure relating to error probability feedback, for instance.

In certain embodiments, apparatus 20 may be controlled by memory 24 and processor 22 to receive, from a network node, configuration for PDU-EP calculation and reporting for at least one network layer. In some embodiments, the configuration may include an indication of a network layer for the PDU-EP calculation, and/or an indication of a specific channel, quality of service flow, radio bearer, and/or leg for the PDU-EP calculation. In an embodiment, the configuration may be received from the network node over RRC. According to one embodiment, the configuration may include a target threshold for the PDU-EP.

According to one embodiment, apparatus 20 may be controlled by memory 24 and processor 22 to enable logging and estimating of BLEP. For example, in an embodiment, apparatus 20 may be controlled by memory 24 and processor 22 to enable BLEP estimation for one or more user plane CBs and log the BLEP values. In one embodiment, apparatus 20 may be controlled by memory 24 and processor 22 to log a mapping of user plane CBs to upper layer PDUs at the at least one network layer.

In some embodiments, apparatus 20 may be controlled by memory 24 and processor 22 to receive one or more PDU(s) from the network node or another network node. According to certain embodiments, apparatus 20 may be controlled by memory 24 and processor 22 to calculate the PDU-EP for the at least one network layer based on the received configuration and the BLEP estimation. According to certain embodiments, when a PDU is decoded that matches to the received configuration, apparatus 20 may be controlled by memory 24 and processor 22 to use the logged BLEP values and the mapping of the user plane CBs to the upper layer PDUs to calculate the PDU-EP for the at least one network layer based on CBs that contributed to transmission of the PDU.

In one embodiment, apparatus 20 may be controlled by memory 24 and processor 22 to calculate the PDU-EP by calculating a joint error probability of a layer immediately lower than the at least one network layer. For example, if the PDU-EP on the at least one layer is denoted as $P_n$, apparatus 20 may be controlled by memory 24 and processor 22 to compute the PDU-EP by calculating joint error probability of the lower layer (N−1)-PDU-EPs denoted by $P_{n-1}$. According to one example, apparatus 20 may be controlled by memory 24 and processor 22 to determine the PDU-EP on the at least one layer according to the following formula: $P_n = 1 - \Pi_{i=1 \ldots M}(1 - P_{n-1}^i)$, where M is the number of (N−1)-PDUs contributed to N-PDU, and I is the index on the subset M.

According to certain embodiments, apparatus 20 may be controlled by memory 24 and processor 22 to transmit, to the network node, feedback related to the PDU-EP. For example, in certain embodiments, apparatus 20 may be controlled by memory 24 and processor 22 to transmit the feedback periodically based on a fixed time interval or received number of PDUs, aperiodically based on triggers, and/or based on meeting certain thresholds.

In some embodiments, the feedback may include one or more of: a single PDU-EP value, a statistical value of a plurality of PDU-Eps, an event indicating PDU-EP is below or above a certain threshold, an identifier of the PDU, an indication of the channel where the PDU-EP was computed, an indication of a number of retransmission for the PDU, and/or an indication of a time difference between reception of a duplicate and primary PDCP PDU. In an embodiment, when the configuration includes a target threshold for the PDU-EP, the feedback may include a single bit indicating whether the PDU-EP is above or below the target threshold. It is noted that, in certain embodiments, the transmission of the feedback may be dynamically switched on or off.

As mentioned above, some embodiments may be applicable to a PDCP duplication scenario. In such example embodiments, apparatus 20 may be controlled by memory 24 and processor 22 to receive a configuration for PDCP PDU-EP measurement and reporting. According to an embodiment, the configuration for the PDCP PDU-EP measurement and reporting may include one or more of: instructions to perform the PDCP PDU-EP measurement per leg, a definition of a threshold for the PDCP PDU-EP measurement, instructions to compute a joint error probability for each of the legs, instructions to compute the threshold comparison for each PDCP PDU, and/or instructions to associate the PDCP PDU-EP measurement with a corresponding PDCP sequence number. In some embodiments, apparatus 20 may be controlled by memory 24 and processor 22 to transmit, to the network node, a PDCP PDU-EP report.

Therefore, certain example embodiments provide several technological improvements, enhancements, and/or advantages over existing technological processes and constitute an improvement at least to the technological field of wireless network control and management. As one example, certain embodiments may improve URLLC, for instance, by introducing a new radio feedback to measure reliability of the radio link. Similarly, some embodiments may provide improvements in other applications such as, but not limited to, eMBB and mMTC, as well as other wireless technologies (e.g., industrial Wi-Fi). It should be noted that some example embodiments can provide improvements in spectral efficiency and may decrease the need for duplication, for example, due to the generation of less interference. Accordingly, the use of certain example embodiments results in improved functioning of communications networks and their nodes, such as base stations, eNBs, gNBs, and/or UEs or mobile stations.

In some example embodiments, the functionality of any of the methods, processes, signaling diagrams, algorithms or flow charts described herein may be implemented by software and/or computer program code or portions of code stored in memory or other computer readable or tangible media, and executed by a processor.

In some example embodiments, an apparatus may be included or be associated with at least one software application, module, unit or entity configured as arithmetic operation(s), or as a program or portions of it (including an added or updated software routine), executed by at least one operation processor. Programs, also called program products or computer programs, including software routines, applets and macros, may be stored in any apparatus-readable data storage medium and may include program instructions to perform particular tasks.

A computer program product may include one or more computer-executable components which, when the program is run, are configured to carry out some example embodiments. The one or more computer-executable components may be at least one software code or portions of code. Modifications and configurations for implementing the functionality of an example embodiment may be performed as routine(s), which may be implemented as added or updated software routine(s). In one example, software routine(s) may be downloaded into the apparatus.

As an example, software or computer program code or portions of code may be in source code form, object code form, or in some intermediate form, and it may be stored in some sort of carrier, distribution medium, or computer readable medium, which may be any entity or device capable of carrying the program. Such carriers may include a record medium, computer memory, read-only memory, photoelectrical and/or electrical carrier signal, telecommunications signal, and/or software distribution package, for example. Depending on the processing power needed, the computer program may be executed in a single electronic digital computer or it may be distributed amongst a number of computers. The computer readable medium or computer readable storage medium may be a non-transitory medium.

In other example embodiments, the functionality may be performed by hardware or circuitry included in an apparatus, for example through the use of an application specific integrated circuit (ASIC), a programmable gate array (PGA), a field programmable gate array (FPGA), or any other combination of hardware and software. In yet another example embodiment, the functionality may be implemented as a signal, such as a non-tangible means, that can be carried by an electromagnetic signal downloaded from the Internet or other network.

According to an example embodiment, an apparatus, such as a node, device, or a corresponding component, may be configured as circuitry, a computer or a microprocessor, such as single-chip computer element, or as a chipset, which may include at least a memory for providing storage capacity used for arithmetic operation(s) and/or an operation processor for executing the arithmetic operation(s).

One having ordinary skill in the art will readily understand that the example embodiments as discussed above may be practiced with procedures in a different order, and/or with hardware elements in configurations which are different than those which are disclosed. Therefore, although some embodiments have been described based upon these example embodiments, it would be apparent to those of skill in the art that certain modifications, variations, and alternative constructions would be apparent, while remaining within the spirit and scope of example embodiments.

We claim:

1. An apparatus, comprising:
at least one processor; and
at least one memory comprising computer program code, the at least one memory and computer program code configured, with the at least one processor, to cause the apparatus at least to
transmit, to at least one user equipment, configuration for protocol data unit error probability calculation and reporting based upon at least one transport block error probability; and
receive, from the at least one user equipment, feedback related to the protocol data unit error probability.

2. The apparatus according to claim 1, wherein the at least one memory and computer program code are configured, with the at least one processor, to cause the apparatus at least to:
transmit at least one protocol data unit to the at least one user equipment.

3. The apparatus according to claim 1, wherein the configuration comprises at least one of:
an indication of a network layer of the protocol data unit error probability calculation; and
an indication of a specific channel, quality of service flow, radio bearer, and/or leg for the protocol data unit error probability calculation.

4. The apparatus according to claim 1,
wherein the feedback is received periodically based on a fixed time interval or received number of protocol data units; or
wherein the feedback is received aperiodically based on triggers; or
wherein the feedback is received based on meeting certain thresholds.

5. The apparatus according to claim 1, wherein the feedback is dynamically switched on or off.

6. The apparatus according to claim 1, wherein the feedback comprises at least one of:
a single protocol data unit error probability value;
a statistical value of a plurality of protocol data unit error probabilities;
an event indicating protocol data unit error probability is below or above a certain threshold;
an identifier of the protocol data unit;
an indication of the channel where the protocol data unit error probability was computed;
an indication of a number of retransmission for the protocol data unit; or
an indication of a time difference between reception of a duplicate and primary packet data convergence protocol (PDCP) protocol data unit.

7. The apparatus according to claim 1, wherein the configuration comprises a target threshold for the protocol data unit error probability, and wherein the feedback comprises a single bit indicating whether the protocol data unit error probability is above or below the target threshold.

8. The apparatus according to claim 7, wherein the at least one memory and computer program code are configured, with the at least one processor, to cause the apparatus at least to:
predict duplication for each packet data convergence protocol (PDCP) protocol data unit; and
temporarily store at least one of a prediction of whether a packet data convergence protocol (PDCP) protocol data unit should be duplicated, a decision on whether to duplicate the packet data convergence protocol (PDCP) protocol data unit, or a sequence number of the packet data convergence protocol (PDCP) protocol data unit.

9. The apparatus according to claim 8, wherein the at least one memory and computer program code are configured, with the at least one processor, to cause the apparatus at least to:
receive a packet data convergence protocol (PDCP) protocol data unit error probability report;
use the packet data convergence protocol (PDCP) protocol data unit error probability report to classify the prediction of whether a packet data convergence protocol (PDCP) protocol data unit should be duplicated; and
determine a label for the prediction based on the classification.

10. The apparatus according to claim 8, wherein the at least one memory and computer program code are configured, with the at least one processor, to cause the apparatus at least to:
use the determined label to train a machine learning model to perform packet data convergence protocol (PDCP) duplication when the duplication is needed.

11. The apparatus according to claim 1, wherein the at least one memory and computer program code are configured, with the at least one processor, to cause the apparatus at least to:

configure the at least one user equipment for packet data convergence protocol (PDCP) protocol data unit error probability measurement and reporting, wherein the configuring of the at least one user equipment comprises at least one of:

providing instructions to perform the packet data convergence protocol (PDCP) protocol data unit error probability measurement per leg, providing a definition of a threshold for the packet data convergence protocol (PDCP) protocol data unit error probability measurement, providing instructions to compute a joint error probability for said each leg, providing instructions to compute the threshold comparison for each packet data convergence protocol (PDCP) protocol data unit, and providing instructions to associate the packet data convergence protocol (PDCP) protocol data unit error probability measurement with a corresponding packet data convergence protocol (PDCP) sequence number.

12. The apparatus according to claim 1, wherein the apparatus comprises at least one of a network node or user equipment.

13. A method, comprising:

transmitting, to at least one user equipment, configuration for protocol data unit error probability calculation and reporting based upon at least one transport block error probability; and receiving, from the at least one user equipment, feedback related to the protocol data unit error probability.

14. A computer program embodied on a non-transitory computer-readable medium, said computer program comprising program instructions which, when executed in hardware, cause the hardware to perform the method according to claim 13.

15. An apparatus, comprising:

at least one processor; and at least one memory comprising computer program code, the at least one memory and computer program code configured, with the at least one processor, to cause the apparatus at least to receive, from a network node, configuration for protocol data unit error probability calculation and reporting based upon at least one transport block error probability for at least one network layer;

enable logging and estimating of block error probability;

calculate the protocol data unit error probability for the at least one network layer based on the received configuration and the block error probability estimation; and transmit, to the network node, feedback related to the protocol data unit error probability.

16. The apparatus according to claim 15, wherein the at least one memory and computer program code are configured, with the at least one processor, to cause the apparatus at least to:

receive at least one protocol data unit from the network node or another network node.

17. The apparatus according to claim 15, wherein the configuration comprises at least one of:

an indication of the at least one network layer for the protocol data unit error probability calculation; and an indication of a specific channel, quality of service flow, radio bearer, and/or leg for the protocol data unit error probability calculation.

18. The apparatus according to claim 15, wherein the at least one memory and computer program code are configured, with the at least one processor, to cause the apparatus at least to enable the estimating of the block error probability for one or more user plane code blocks, the logging of the block error probability values, and the logging of a mapping of user plane code blocks to upper layer protocol data units at the at least one network layer.

19. The apparatus according to claim 18, wherein the at least one memory and computer program code are configured, with the at least one processor, to cause the apparatus at least to, when a protocol data unit is decoded that matches to the received configuration, use the logged block error probability values and the mapping of the user plane code blocks to the upper layer protocol data units to calculate the protocol data unit error probability for the at least one network layer based on code blocks that contributed to transmission of the protocol data unit.

20. The apparatus according to claim 15, wherein the at least one memory and computer program code are configured, with the at least one processor, to cause the apparatus at least to compute the protocol data unit error probability by calculating a joint error probability of a layer immediately lower than the at least one network layer.

21. The apparatus according to claim 15, wherein the feedback is transmitted periodically based on a fixed time interval or received number of protocol data units; or wherein the feedback is transmitted aperiodically based on triggers; or wherein the feedback is transmitted based on meeting certain thresholds.

22. The apparatus according to claim 15, wherein the feedback is dynamically switched on or off.

23. The apparatus according to claim 15, wherein the feedback comprises at least one of:

a single protocol data unit error probability value;

a statistical value of a plurality of protocol data unit error probabilities;

an event indicating protocol data unit error probability is below or above a certain threshold;

an identifier of the protocol data unit;

an indication of the channel where the protocol data unit error probability was computed;

an indication of a number of retransmission for the protocol data unit; or an indication of a time difference between reception of a duplicate and primary packet data convergence protocol (PDCP) protocol data unit.

24. The apparatus according to claim 15, wherein the configuration comprises a target threshold for the protocol data unit error probability, and wherein the feedback comprises a single bit indicating whether the protocol data unit error probability is above or below the target threshold.

25. The apparatus according to claim 15, wherein the at least one memory and computer program code are configured, with the at least one processor, to cause the apparatus at least to:

receive a configuration for packet data convergence protocol (PDCP) protocol data unit error probability measurement and reporting comprising at least one of:

instructions to perform the packet data convergence protocol (PDCP) protocol data unit error probability measurement per leg, a definition of a threshold for the packet data convergence protocol (PDCP) protocol data unit error probability measurement, instructions to compute a joint error probability for said each leg, instructions to compute the threshold comparison for each packet data convergence protocol (PDCP) protocol data unit, and instructions to associate the packet data convergence protocol (PDCP) protocol data unit error probability measurement with a corresponding packet data convergence protocol (PDCP) sequence number; and transmit, to the network node, a packet data convergence protocol (PDCP) protocol data unit error probability report.

26. The apparatus according to claim 15, wherein the apparatus comprises a user equipment, and wherein the network node comprises at least one of a gNB or user equipment.

27. A method, comprising:

receiving, at a user equipment, a configuration from a network node, wherein the configuration is for protocol data unit error probability calculation and reporting based upon at least one transport block error probability for at least one network layer;

enabling logging and estimating of block error probability;

calculating the protocol data unit error probability for the at least one network layer based on the received configuration and the block error probability estimation; and transmitting, to the network node, feedback related to the protocol data unit error probability.

28. A computer program embodied on a non-transitory computer-readable medium, said computer program comprising program instructions which, when executed in hardware, cause the hardware to perform the method according to claim 27.

* * * * *